United States Patent [19]
Lim et al.

[11] Patent Number: 6,084,808
[45] Date of Patent: Jul. 4, 2000

[54] CIRCUITS AND METHODS FOR BURN-IN OF INTEGRATED CIRCUITS USING POTENTIAL DIFFERENCES BETWEEN ADJACENT MAIN WORD LINES

[75] Inventors: Jong-Hyoung Lim; Sang-Seok Kang; Jin-Seok Lee, all of Kyunggki-do; Byung-Il Ryu, Seoul, all of Rep. of Korea

[73] Assignee: Samsung Electronics Co., Ltd., Rep. of Korea

[21] Appl. No.: 09/199,903

[22] Filed: Nov. 25, 1998

[30] Foreign Application Priority Data

Nov. 25, 1997 [KR] Rep. of Korea ............ 97-62868

[51] Int. Cl.$^7$ ............................................ G11C 7/00
[52] U.S. Cl. ........................... 365/201; 365/230.06
[58] Field of Search ................. 365/201, 230.04, 365/230.06, 230.01; 324/765, 769

[56] References Cited

U.S. PATENT DOCUMENTS

| | | | |
|---|---|---|---|
| 4,380,805 | 4/1983 | Proebsting | 365/201 |
| 5,148,401 | 9/1992 | Sekino et al. | 365/230.03 |
| 5,276,647 | 1/1994 | Matsui | 365/201 |
| 5,363,333 | 11/1994 | Tsujimoto | 365/201 |
| 5,371,712 | 12/1994 | Oguchi et al. | 365/201 |
| 5,416,748 | 5/1995 | Fujita | 365/230.06 |
| 5,436,910 | 7/1995 | Takeshima et al. | 365/201 |
| 5,590,079 | 12/1996 | Lee et al. | 365/201 |
| 5,761,135 | 6/1998 | Lee | 365/189.11 |
| 5,764,585 | 6/1998 | Matsubara | 365/230.06 |
| 5,848,021 | 12/1998 | Sugibayashi | 365/201 |
| 5,963,503 | 10/1999 | Lee | 365/233 |

*Primary Examiner*—Richard Elms
*Assistant Examiner*—Anh Phung
*Attorney, Agent, or Firm*—Myers Bigel Sibley & Sajovec

[57] ABSTRACT

External address signals are applied to an integrated circuit in a burn-in test mode. The external address signals control the voltage levels of adjacent main word lines in a memory array in the integrated circuit. The adjacent main word lines may thereby be configured in to be in opposing logic states. The opposing logic states may provide a potential difference between the adjacent main word lines, thereby increasing the likelihood of detecting microbridges between the adjacent main word lines formed during fabrication of the integrated circuit. The reliability of the integrated circuit may thereby be improved.

17 Claims, 5 Drawing Sheets

CIRCUITS AND METHODS FOR BURN-IN OF INTEGRATED CIRCUITS USING POTENTIAL DIFFERENCES BETWEEN ADJACENT MAIN WORD LINES

FIELD OF THE INVENTION

The present invention relates to the field of integrated circuits and more particularly to testing of integrated circuits.

BACKGROUND OF THE INVENTION

Integrated circuits, such as Dynamic Random Access Memories (DRAMs), Static Random Access Memories (SRAMs) or Electrically Erasable Programmable Read-Only Memories (EEPROMs), may undergo stress testing or "burn-in test" prior to shipment in an effort to detect defects in the integrated circuits. By subjecting a device to extreme operating conditions, such as, exposing the integrated circuit to abnormally high temperature and high voltage, the reliability and performance of the integrated circuits in normal operating conditions may be predicted. Conventional stress testing techniques are disclosed, for example, in U.S. Pat. Nos. 4,380,805; 5,363,333; and 5,590,079. U.S. Pat. No. 5,590,079 is hereby incorporated herein by reference.

A hierarchical word line structure (also referred to as a "split" or "segmented" word line structure) including main word lines and subword lines has been adopted for large capacity integrated circuit memory devices such as those having 16 Mb capacity or greater. Such a word line structure may use one conductive line as a main word line electrically connected to 4 or 8 subword lines of polysilicon. Accordingly, a high density (e.g., 64 Mb or greater) integrated circuit memory may be constructed without necessarily increasing the chip area. Examples of such word line structures are discussed in U.S. Pat. Nos. 5,148,401; 5,416,748; 5,761,135; and 5,764,585. U.S. Pat. No. 5,761,135 is hereby incorporated herein by reference.

As the level of integration of integrated circuits increases, there may also be a reduction in the spacing between adjacent conductive lines in the integrated circuits which may increase the likelihood of failures in the integrated circuits. In particular, bridges may form between conductive lines which may cause electrical shorts between the conductive lines, thereby causing the integrated circuit to fail. Accordingly, a need exists to further improve burn-in testing of integrated circuits.

SUMMARY OF THE INVENTION

It is, therefore, an object of the present invention to increase the reliability of integrated circuits.

It is a further object of the present invention to improve burn-in testing of integrated circuits.

These another objects of the present invention are provided by generating voltage levels for adjacent main word lines in an integrated circuit in a burn-in test mode using external address signals applied to the integrated circuit. The external address signals control the voltage levels of adjacent main word lines in a memory array in the integrated circuit. The adjacent main word lines may be driven to opposing voltage levels. The opposing voltage levels may provide a potential difference between the adjacent main word lines, thereby increasing the likelihood of detecting microbridges between the adjacent main word lines during burn-in testing. The reliability of the integrated circuit may thereby be improved.

In one embodiment of the present invention, the external address signals are used to simultaneously activate all of the even numbered main word lines in the integrated circuit. In another embodiment, the external address signals activate all of the odd numbered main word lines in the integrated circuit.

In a further aspect of the present invention, a burn-in control circuit provides a control signal that controls voltage levels of internal address signals. An address buffer generates internal address signals based on a plurality of external address signals applied to the integrated circuit memory and the control signal that controls the voltage levels of the internal address signals. Adjacent main word lines, responsive to the plurality of internal address signals, are configured at voltage levels that correspond to opposite logic states. For example, a first main word line may be configured in a logic low state and a second main word line, adjacent to the first main word line, may be configured in a high logic state. The low logic state corresponds to a low voltage level for CMOS or TTL logic. The high logic state corresponds to a high voltage level for CMOS or TTL logic. Consequently, the adjacent main word lines are configured at opposing voltage levels. The likelihood of detecting a short between the adjacent main word lines may be increased.

DETAILED DESCRIPTION OF PREFERRED EMBODIMENT

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

The voltage levels described herein correspond to Complementary Metal-Oxide Semiconductor (CMOS) logic levels or to Transistor-Transistor Logic (TTL) logic levels. Accordingly, a signal described as in a logic state is configured to have a corresponding voltage level. For example, a signal that is in a low logic state (low) is at a low voltage level. In contrast, a signal that is in a high logic state (high) is at a high voltage level. Therefore, a potential difference exists between two signals that are at opposite voltage levels.

Figure 1:
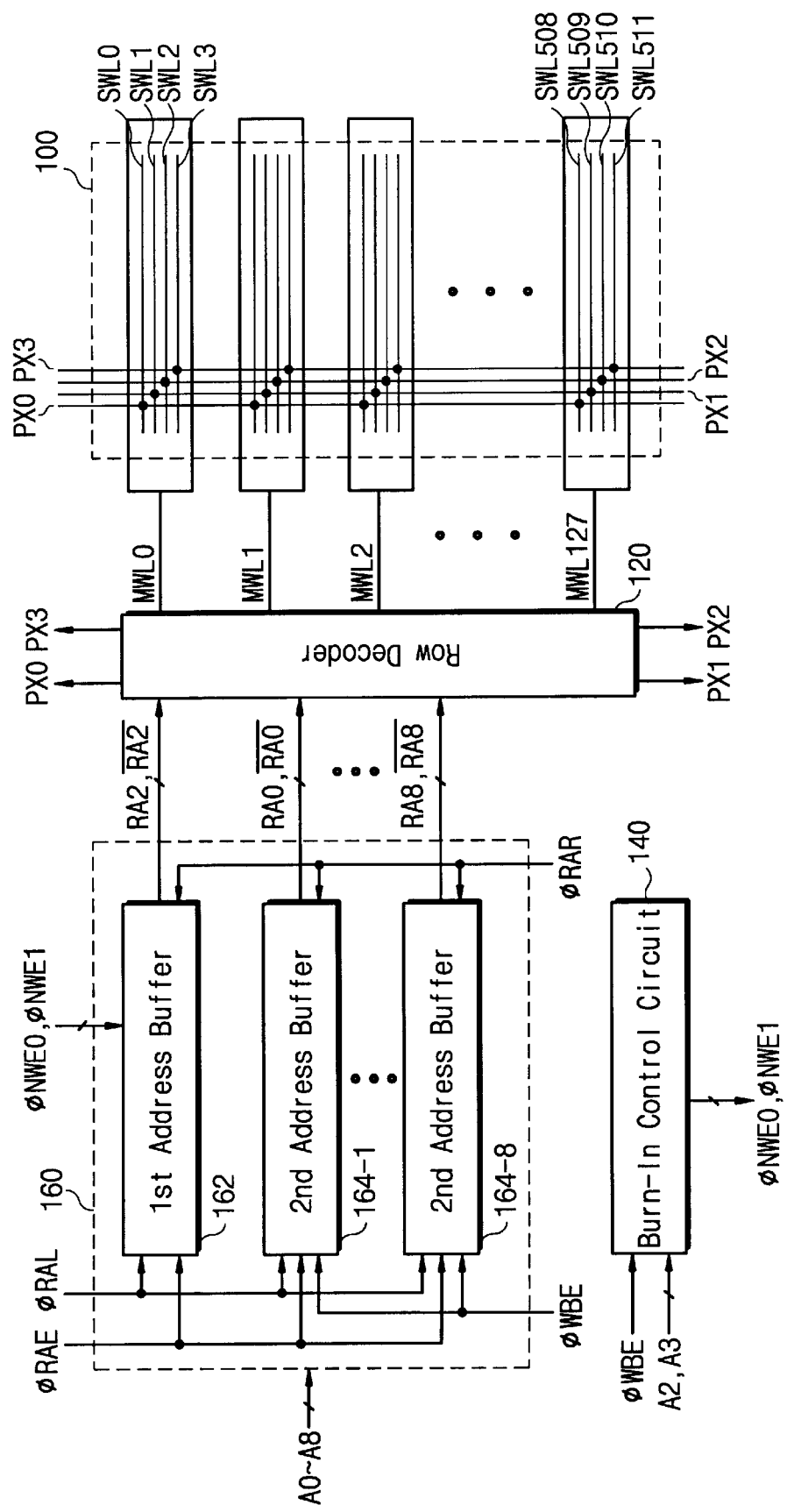
FIG. 1 is a block diagram that illustrates an embodiment of an integrated circuit memory according to the present invention.

FIG. 1 is a block diagram that illustrates an embodiment of an integrated circuit memory according to the present invention. According to FIG. 1, external row addresses A0–A8 are provided to a row address buffer 160. The external row address signals A0–A8 are latched in the row address buffer 160 in response to a row address enable signal φ RAE and a row address latch signal φ RAL. The row address buffer 160 includes a first address buffer 162 which buffers and latches the external row address A2 to provide internal row address signals RA2 and $\overline{RA2}$. In a preferred embodiment, the external address signals are provided at TTL voltage levels.

The row address buffer 160 also includes a plurality of second address buffers 164-1 through 164-8 which latch external row address signals A0, A1, A3, A4, A5, A6, A7 and A8 to provide respective internal row address signals RA0, $\overline{RA0}$, RA1, $\overline{RA1}$, RA3, $\overline{RA3}$, RA4, $\overline{RA4}$, RA5, $\overline{RA5}$, RA6, $\overline{RA6}$, RA7, $\overline{RA7}$, and RA8, $\overline{RA8}$.

The address buffers 162, 164-1 through 164-8 are reset by a row address reset signal φ RAR. The address buffers 162, 164-1 through 164-8 output the internal address signals RA0, $\overline{RA0}$ through RA8, $\overline{RA8}$ when the row address reset signal φ RAR is active low.

A row decoder 120 decodes the internal row address signals RA0, $\overline{RA0}$, . . . , RA8, $\overline{RA8}$ and generates word line signals on main word lines MWL0–MWL127 of a memory array 100. In particular, the row decoder 120 decodes internal row address signals RA0 and RA1 to generate subword select signals PX0–PX3 on subword lines (e.g., SWL0–SWL3, . . . SWL508–SWL511) within the memory array 100. The row decoder 120 also decodes row address signals RA2–RA8 to generate word line voltages on main word lines MWL0–MWL127. Accordingly, the combination of the subword lines SWL0–SWL3 with the subword select lines PX0–PX3 select a particular subword line to be accessed within the memory array 100. In a preferred embodiment, the internal address signals are provided at CMOS voltage levels.

A burn-in control circuit 140 controls the row address buffer 160 and the row decoder 120 during burn-in test mode. In particular, the burn-in control circuit 140 is activated by a burn-in enable signal φ WBE and external row address signals A2 and A3. When burn-in test mode is enabled the burn-in control circuit 140 generates control signals φ NWE0 and φ NWE1 which control the voltage levels associated with internal row address signals RA2 and $\overline{RA2}$ generated by the row address buffer 160. The burn-in enable signal φ WBE is provided to the row address buffer 160 to control the second address buffers 164-1 to 164-8. Control signals φ NWE0 and φ NWE1 may be activated to control the voltage level of adjacent main word lines MWL0–MWL127 and are provided to the first address buffer 162.

Figure 2:
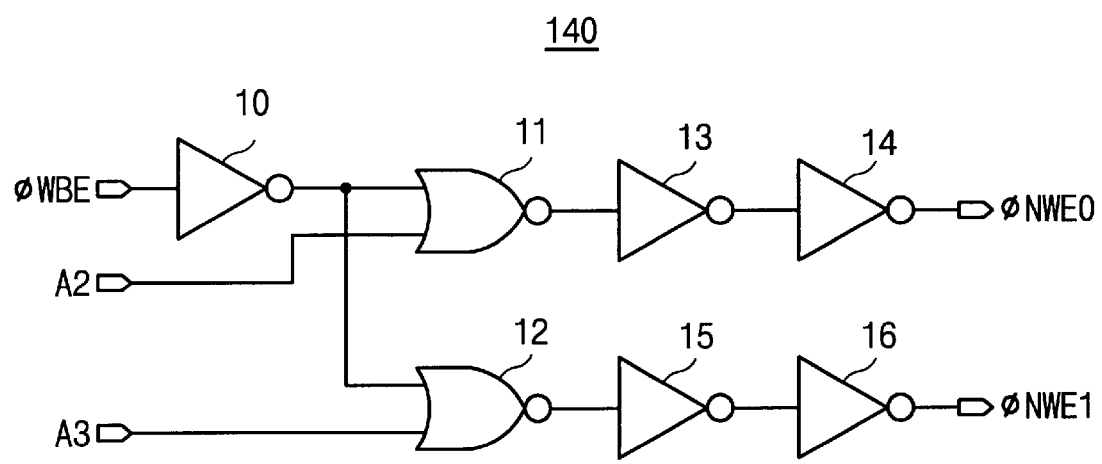
FIG. 2 is a schematic diagram that illustrates an embodiment of a burn-in control circuit of FIG. 1.

FIG. 2 is a schematic diagram that illustrates an embodiment of a burn-in control circuit 140 of FIG. 1. Referring to FIG. 2, the burn-in control circuit 140 includes inverters 10, 13–16, and NOR gates 11 and 12. The burn-in test enable signal φ WBE is applied to NOR gates 11 and 12 via the inverter 10. The external addresses A2 and A3 are fed to the NOR gates 11 and 12, respectively. An output of the NOR gate 11 is provided as the control signal φ NWE0 via the inverters 13 and 14. An output of the NOR gate 12 is provided as the control signal φ NWE1 via the inverters 15 and 16.

The truth table for the burn-in control circuit 140 is as follows:

TABLE 1

| Input | | | Output | |
|---|---|---|---|---|
| φ WBE | A2 | A3 | φ NWE0 | φ NEW1 |
| L | X | X | L | L |
| H | L | L | H | H |
| H | L | H | H | L |
| H | H | L | L | H |
| H | H | H | L | L |

In normal operating mode, the signal φ WBE is inactive at a low level. Consequently, the control signals φ NWE0 and φ NWE1 go low independent of the address signals A2 and A3. When the signal φ WBE becomes active high, the voltage levels of the control signals φ NWE0 and φ NWE1 depend on the value of A2 and A3. In particular, the control signals φ NWE0 and φ NWE1 go high when both of the external row address signals A2 and A3 are low. Further, the control signals φ NWE0 and φ NWE1 become low when the external address signals A2 and A3 are high.

Figure 3:
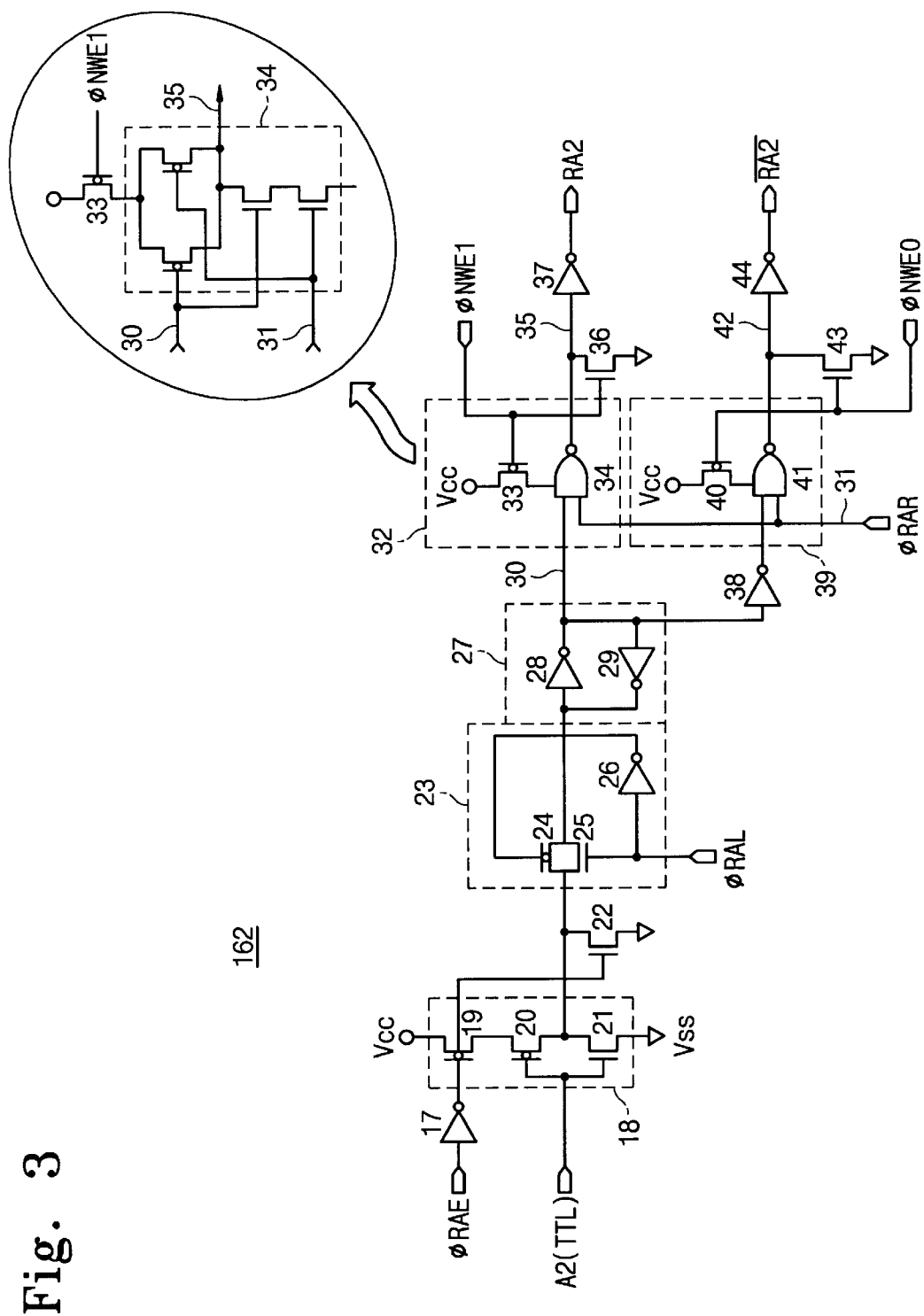
FIG. 3 is a schematic diagram that illustrates an embodiment of a first address buffer of FIG. 1.

FIG. 3 is a block diagram that illustrates an embodiment of a first address buffer 162 of FIG. 1. The first address buffer 162 is comprised of inverters 17, 18, 38, 37 and 44, N channel MOS (NMOS) switching transistors 22, 36 and 43, a CMOS transmission gate circuit 23, a latch circuit 27, and NAND logic circuits 32 and 39. The transmission gate circuit 23 comprises a PMOS transistor 24, an NMOS transistor 25 and an inverter 26. The latch circuit 27 comprises two cross-coupled inverters 28 and 29. The inverter 18 and the NAND logic circuits 32 and 39 are similar in construction to dynamic logic circuits having time-varying properties. The dynamic inverter 18 includes P-channel MOS transistors 19 and 20, and an NMOS transistor 21 coupled in series between a power supply voltage Vcc and a reference voltage (i.e., ground voltage) Vss, as illustrated. The external row address signal A2 is applied to the gates of the transistors 20 and 21. The dynamic NAND logic circuit 32 includes a PMOS transistor 33 and a NAND gate 34. The dynamic NAND logic circuit 39 includes a PMOS transistor 40 and a NAND gate 41. The conduction path of the switching transistor 22 is coupled in parallel with that of the transistor 21 in the dynamic inverter 18.

The complement of the address buffer enable signal φ RAE is applied to gates of the transistors 19 and 22. The external address signal A2 is transferred to the latch circuit 27 via the dynamic inverter 18 and the transmission gate circuit 23. The transmission gate circuit 23 opens/closes in response to the row address latch signal φ RAL.

An output of the latch circuit 27 is provided to an input of the NAND gate 34 in the dynamic logic circuit 32 and to an input of the NAND gate 41 in the dynamic logic circuit 39 via the inverter 38. The other inputs of the NAND gates 34 and 41 are supplied with the row address reset signal φ RAR. The NMOS switching transistor 36 has its conduction path coupled between a node 35 and the ground voltage Vss. The NMOS switching transistor 43 also has its conduction path coupled between a node 42 and the ground voltage Vss.

The signal φ NWE1 is provided to gates of the transistors 33 and 36. The signal φ NWE0 is provided to gates of the transistors 40 and 43. The inverters 37 and 44 output the row address signals RA2 and $\overline{RA2}$ at complementary CMOS levels, respectively. The row address signal RA2 is used to activate odd-numbered main word lines MWL1, MWL3, . . . , and MWL127. That is, when the internal row address signal RA2 is active at a high level, the odd-numbered main word lines MWL1, MWL3, ..., and MWL127 are active at high levels as well. The address signal $\overline{RA2}$ is used to activate even-numbered main word lines MWL0, MWL2, ..., and MWL126.

Figure 4:
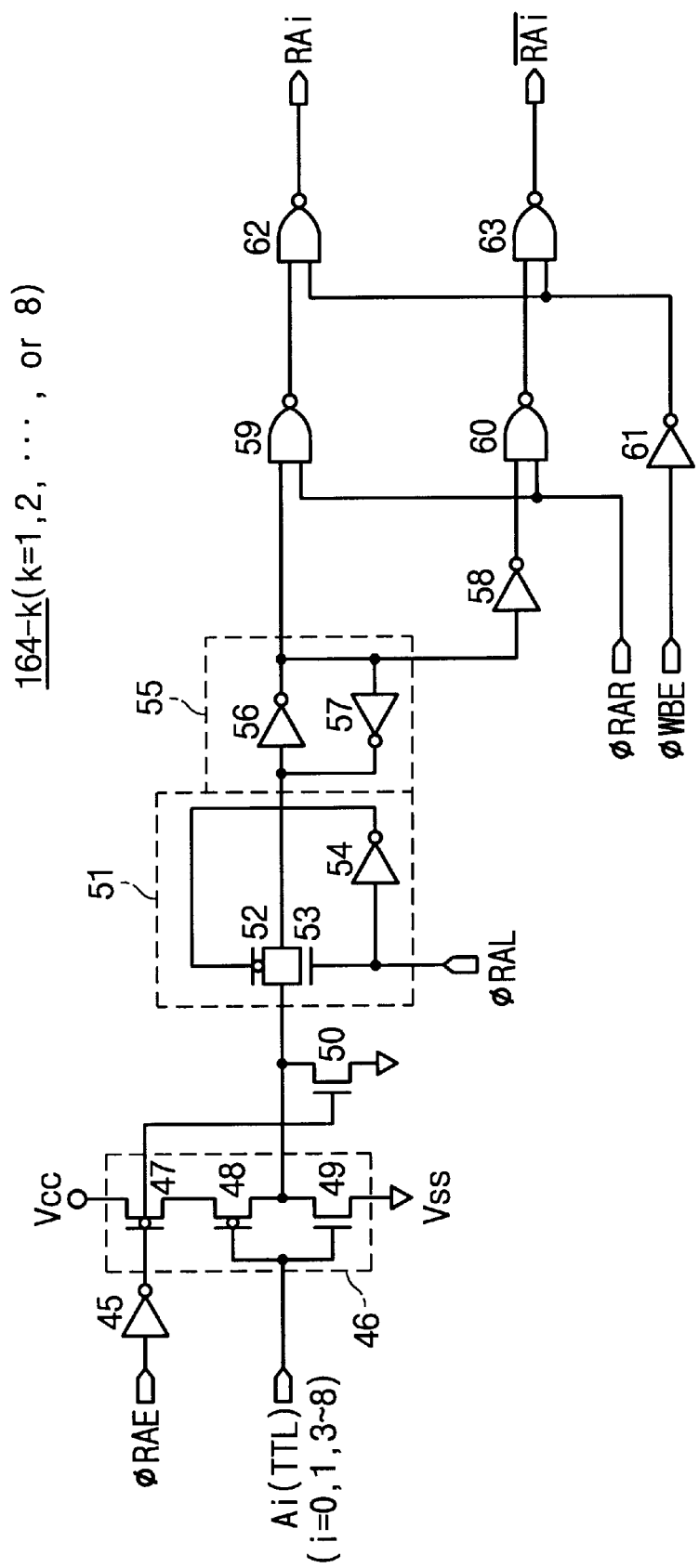
FIG. 4 is schematic diagram that illustrates an embodiment of a second address buffer of FIG. 1.

FIG. 4 is a schematic diagram that illustrates an embodiment of a second address buffer 164-1 to 164-8 of FIG. 1. Referring to FIG. 4, the address buffer 164-k (where, k=1, 2, ..., or 8) includes inverters 45, 46, 58 and 61, an NMOS switching transistor 50, a transmission gate circuit 51, a latch circuit 55, and NAND gates 59, 60, 62 and 63. The inverter 46 is a dynamic circuit including transistors 47, 48 and 49. The conduction paths of the transistors 47, 48 and 49 are coupled in series between the power supply voltage Vcc and the ground voltage Vss. The conduction path of the switching transistor 50 is coupled in parallel with that of the transistor 49 in the dynamic inverter 46. The complement of the row address buffer enable signal φ RAE is applied to the gates of the transistors 45 and 50. A corresponding external row address signal Ai (where, i=0, 1, 3, 4, ..., or 8) is provided via the dynamic inverter 46 and the transmission gate circuit 51 to the latch circuit 55 comprising cross-coupled inverters 56 and 57. The transmission gate circuit 55 opens/closes in response to the row address latch signal φ RAL.

An output of the latch circuit 55 is provided to an input of the NAND gate 59 and to an input of the NAND gate 60 via the inverter 58. The other inputs of the NAND gates 59 and 60 are supplied with the row address reset signal φ RAR. An output of the NAND gate 59 is provided to an input of the NAND gate 62, and an output of the NAND gate 60 is provided to an input of the NAND gate 63. The burn-in enable signal φ WBE is supplied to the other inputs of the NAND gates 62 and 63 via the inverter 61. The NAND gates 62, 63 output a corresponding pair of complementary internal row address signals RAi and $\overline{RAi}$ (where, i=0, 1, 3, 4, ..., or 8), respectively.

Figure 5:
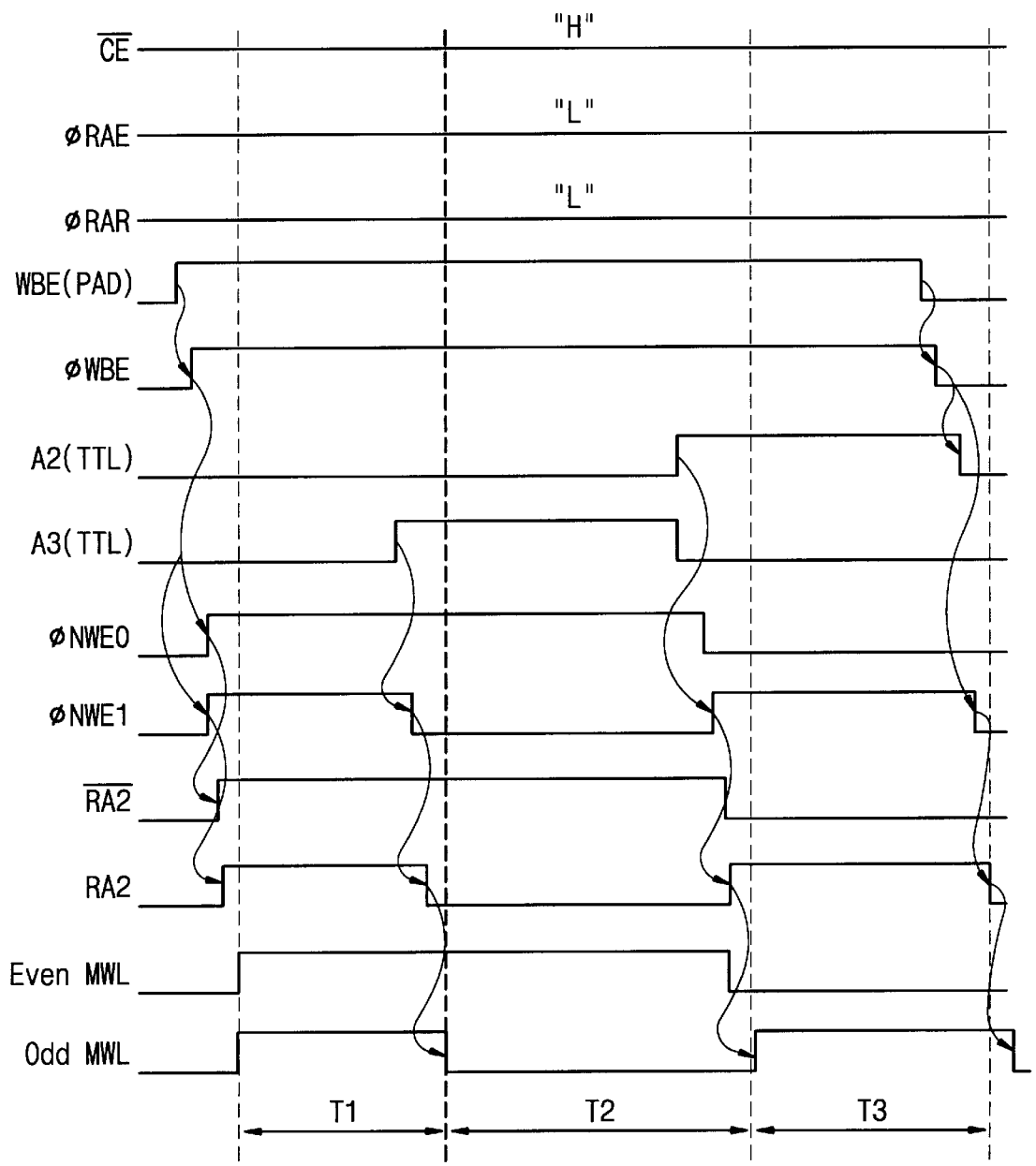
FIG. 5 is a timing diagram that illustrates operations of a burn-in control circuit according to the present invention.

FIG. 5 is a timing diagram that illustrates operations of a burn-in circuit according to the present invention. According to FIG. 5, the burn-in test mode begins with the application of a chip enable signal $\overline{CE}$ at a high level, the row address enable signal φ RAE at a low level, the row address reset signal φ RAR at a low level and the external and internal burn-in test enable signals WBE and φ WBE at a high level.

During time interval T1, both of the external row address signals A2 and A3 are low and the control signals φ NWE0 and φ NWE1 all are high. Thus, the switching transistors 36 and 43 in the first address buffer 162 are turned on while the transistors 33 and 40 are turned off, so that both of the internal address signals RA2 and $\overline{RA2}$ are high. As a result, all main word lines (i.e., both of the even- and odd-numbered main word lines) MWL0–MWL127 are activated.

During period T2, the external row address signals A2 and A3 go low and high, respectively. Accordingly, the control signals φ NWE0 and φ NWE1 become high and low, respectively. The NAND logic circuit 32 becomes enabled and the switching transistor 36 becomes non-conductive while the NAND logic circuit 39 remains disabled and the switching transistor 43 is turned on, so that the node 35 goes high while the node 42 remains low. The internal address signals RA2 and $\overline{RA2}$ are low and high, respectively. Therefore, even-numbered main word lines MWL0, MWL2, ..., WL126 are activated. As a result, a potential difference exists between adjacent odd- and even-numbered main word lines.

During period T3, the external row address signals A2 and A3 go high and low, respectively. The control signals φ NWE0 and φ NWE1 become low and high, respectively. Therefore, the NAND logic circuit 32 becomes disabled and the switching transistor 36 becomes conductive while the NAND logic circuit 39 becomes enabled and the switching transistor 43 becomes non-conductive, so that the node 35 goes low while the node 42 goes high. The internal address signals RA2 and $\overline{RA2}$ are thus high and low, respectively. Therefore, only the odd-numbered main word lines MWL1, MWL3, ..., WL127 are active. As a result, a potential difference exists between adjacent odd- and even-numbered main word lines. Accordingly, the burn-in enable signal 0WBE can be used to override the normal addressing provided by the row address buffer 160. In particular, the burn-in enable signal can be used to control the voltage level of row address signals RA2, $\overline{RA2}$.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of testing an integrated circuit comprising the steps of:
    activating a plurality of main word lines in the integrated circuit during the burn-in test interval to provide complementary logic levels between adjacent main word lines during a first portion of the burn-in test interval and provide equal logic levels between adjacent main word lines during a second portion of the burn-in test interval.

2. The method of claim 1, wherein the step of activating comprises the steps of:
    enabling a burn-in test mode of the integrated circuit;
    activating a plurality of external address signals electrically connected to integrated circuit;
    selecting ones of the plurality of main word lines for activation in the integrated circuit; and
    activating the selected ones of the plurality of main word lines in the integrated circuit to provide a potential difference between adjacent main word lines.

3. The method of claim 2, wherein the step of activating the selected ones of the plurality of main word lines comprises the step of activating all odd numbered main word lines in the integrated circuit.

4. The method of claim 2, wherein the step of activating the selected ones of the plurality of main word lines comprises the step of activating all even numbered main word lines in the integrated circuit.

5. The method of claim 2, wherein the step of activating the selected ones of the plurality of main word lines comprises the step of activating all even and odd numbered main word lines in the integrated circuit.

6. An integrated circuit memory comprising:
    a burn-in control circuit that provides a control signal that controls respective voltage levels of a plurality of internal address signals;
    an address buffer that generates a plurality of internal address signals based on a plurality of external address signals applied to the integrated circuit memory and the control signal that controls the respective voltage levels of the plurality of internal address signals; and
    a plurality of main word lines, responsive to the plurality of internal address signals, wherein respective logic levels of adjacent main word lines are complementary during a first portion of the burn-in test interval and equal during a second portion of the burn-in test interval.

7. The integrated circuit memory of claim 6 further comprising a row decoder that generates the plurality of main word lines based on the plurality of internal address signals.

8. An integrated circuit memory comprising:
    means for enabling a burn-in test mode of the integrated circuit;
    means for activating a plurality of external address signals electrically connected to integrated circuit;
    means for selecting ones of the plurality of main word lines for activation in the integrated circuit;
    means for activating the selected ones of the plurality of main word lines in the integrated circuit to provide complementary logic levels between adjacent main word lines during a first portion of the burn-in test interval and provide equal logic levels between adjacent main word lines during a second portion of the burn-in test interval.

9. An integrated circuit semiconductor memory device comprising:
    a plurality of first word lines coupled with memory cells;
    a plurality of second word lines each corresponding to multiple ones of said first word lines;
    a row address buffer circuit responsive to external row address signals, for generating internal row address signals; and
    means responsive to a portion of said external row address signals, for exerting a potential difference between adjacent ones of said second word lines during a burn-in test mode.

10. The memory device according to claim 9, wherein said means controls said row address buffer circuit to selectively adjust electric potential of a portion of the internal row address signals associated with addressing of said second word lines in the burn-in test mode.

11. An integrated circuit memory device having a hierarchical word line structure, comprising:
    a plurality of main word lines;
    a plurality of sub word lines, wherein each of said main word line corresponds to multiple ones of said sub word lines;
    a row address buffer circuit responsive to external row address signals, for generating internal address signals used to selectively drive said main word lines; and
    a burn-in control circuit responsive to a portion of the external row address signals and a signal indicative of the burn-in test mode, for generating first and second control signals;
    wherein said row address buffer circuit selectively adjusts electric potential of a portion of the internal row address signals in response to the first and second control signals.

12. The memory device according to claim 11, wherein said row address buffer circuit adjusts electric potential of the internal row address signals of a least significant bit position in response to the first and second control signals.

13. In an integrated circuit memory device having a hierarchical word line structure containing main word lines and sub-word lines, a method of testing the integrated circuit memory device, comprising the steps of:
    driving a pair of adjacent main word lines to an active logic level during a first portion of a test time interval; then
    driving a first main word line and a second main word line in the pair of adjacent main word lines to an inactive logic level and an active logic level, respectively, during a second portion of the test time interval; and then
    driving the first main word line and the second main word line in the pair of adjacent main word lines to an active logic level and an inactive logic level, respectively, during a third portion of the test time interval.

14. An integrated circuit memory device having a hierarchical word line structure containing main word lines and sub-word lines, comprising:
    a memory cell array having a plurality of even main word lines and a plurality of odd main word lines electrically coupled thereto;
    a burn-in control circuit that generates at least a first burn-in control signal in response to a burn-in test enable signal; and
    a row address buffer that generates a pair of burn-in row address signals (RA2, $\overline{RA2}$) that have complementary logic levels during a first portion of a burn-in test time interval and have equal logic levels during a second portion of the burn-in test time interval.

15. The memory device of claim 14, further comprising:
    a row decoder that generates logic 1 and logic 0 voltage levels on the even and odd main word lines, respectively, in response to the pair of burn-in row address signals.

16. The memory device of claim 15, wherein said row decoder is electrically coupled to said row address buffer by a plurality of pairs of complementary internal row address signal lines; and wherein the pair of burn-in row address signals are generated on one of the pairs of complementary internal row address signal lines.

17. The memory device of claim 16, wherein the plurality of pairs of complementary internal row address signal lines include a least significant pair of complementary internal row address signal lines and a most significant pair of complementary internal row address signal lines; and wherein the pair of burn-in row address signals are not generated on the least significant pair of complementary internal row address signal lines.

* * * * *